United States Patent
Niu et al.

(10) Patent No.: US 9,469,904 B2
(45) Date of Patent: Oct. 18, 2016

(54) SURFACE PROCESSING METHOD FOR A HIGH HARDNESS AND ABRASION RESISTANT ZINC ALLOY SURFACE OF IMITATION PLATING HEXVALENT CHROMIUM

(71) Applicant: Ningbo Runner Industrial Corporation, Ningbo (CN)

(72) Inventors: Hu-Dong Niu, Ningbo (CN); Ying-Quan Wang, Ningbo (CN); Song Ming, Ningbo (CN); Zi-Bao Wu, Ningbo (CN)

(73) Assignee: NINGBO RUNNER INDUSTRIAL CORPORATION, Ningbo (CN)

( * ) Notice: Subject to any disclaimer, the term of this patent is extended or adjusted under 35 U.S.C. 154(b) by 0 days.

(21) Appl. No.: 14/804,685

(22) Filed: Jul. 21, 2015

(65) Prior Publication Data
US 2016/0024661 A1    Jan. 28, 2016

(30) Foreign Application Priority Data
Jul. 22, 2014    (CN) .......................... 2014 1 0347609

(51) Int. Cl.
| | |
|---|---|
| *C23C 28/00* | (2006.01) |
| *C23C 14/34* | (2006.01) |
| *C25D 13/20* | (2006.01) |
| *C09D 5/44* | (2006.01) |
| *C23C 14/02* | (2006.01) |
| *C23C 14/06* | (2006.01) |
| *C23C 14/14* | (2006.01) |

(52) U.S. Cl.
CPC ............... *C23C 28/00* (2013.01); *C09D 5/448* (2013.01); *C23C 14/021* (2013.01); *C23C 14/0605* (2013.01); *C23C 14/0641* (2013.01); *C23C 14/14* (2013.01); *C23C 14/345* (2013.01); *C23C 14/3471* (2013.01); *C25D 13/20* (2013.01)

(58) Field of Classification Search
CPC . C23C 28/00; C23C 14/345; C23C 14/3471; C23C 14/021; C23C 14/0605; C23C 14/0641; C23C 14/14; C25D 13/20; C09D 5/448
See application file for complete search history.

(56) References Cited

FOREIGN PATENT DOCUMENTS

| | | |
|---|---|---|
| CN | 102758176 A | 10/2012 |
| CN | 102758237 A | 10/2012 |

*Primary Examiner* — Kishor Mayekar
(74) *Attorney, Agent, or Firm* — Chun-Ming Shih

(57) ABSTRACT

A surface processing method for a high hardness and abrasion resistant zinc alloy surface of imitation plating hexavalent chromium, includes following steps. Perform polishing for surface of zinc alloy workpiece, and leave it to dry; place the dried up workpiece into Hydrofluoric Acid solution to raise adhesion; wash the activated workpiece clean with pure water, and then place it in a silane oxide solution, to process it into silane conversion film; place the workpiece into an electrophoresis solution to perform electrophoresis, to achieve an electrophoresis application layer; use an UF solution to wash the workpiece; perform pre-drying for the workpiece; perform UV curing for the workpiece; hang the workpiece in a PVD furnace, perform sputtering of chromium, to form a metal-ceramic composite film; and perform PVD on surface of the workpiece, to deposit a layer of transparent DLC film on the workpiece.

1 Claim, No Drawings

SURFACE PROCESSING METHOD FOR A HIGH HARDNESS AND ABRASION RESISTANT ZINC ALLOY SURFACE OF IMITATION PLATING HEXVALENT CHROMIUM

BACKGROUND OF THE INVENTION

1. Field of the Invention

The present invention relates to a surface processing method, and in particular to a surface processing method for a high hardness and abrasion resistant zinc alloy surface of imitation plating hexavalent chromium.

2. The Prior Arts

Presently on the market, the zinc alloy chromium plated products are plated with hexavalent chromium, and that are produced through the conventional electroplating. However, the conventional electroplating of zinc alloy has the following drawbacks and shortcomings: 1. It consumes large amount of water and energy, to produce large amount of waste water and waste scum, such that its waste treatment expense is high. 2. It utilizes detrimental chemical plating solutions and additives. 3. It could produce toxic gases in the production process. 4. It consumes large amount of metal. 5. It utilizes hexavalent chromium, and that is harmful to the human body.

In this respect, bubbles often occur in the plated layer of hexavalent chromium for the zinc alloy, such that the plated layer tends to detach from and fall off the substrate. Moreover, the casting and pressing of the zinc alloy can greatly affect the quality of the electroplating, such that the plated surface is not allowed to have the defects of loose texture, crack wrinkles, air holes, air bubbles, shrunken holes, cold wrinkles, and needle holes, etc., otherwise, it could lead to defective outer appearance of the electroplated layer, and the problem of unsatisfying performance.

In this respect, the various shortcomings and drawbacks of the prior art are described as follows:

In a China Patent Case No. CN 102758237A is disclosed "surface processing method for a high etch resistance zinc alloy of imitation hexavalent chromium color", including the following steps:

1. Perform ultrasonic de-wax and de-grease treatments for a zinc alloy blank.

2. Perform anode oxidation processing, for the zinc alloy blank processed by step 1.

3. Perform electrophoresis application, water washing, and baking and drying processing for the zinc alloy blank processed by step 2.

4. Transfer the zinc alloy blank processed in step 3 to a paint spraying and ultraviolet light (UV) curing line, to perform UV primer (bottom paint) spraying, leveling, and UV curing.

5. Hang the zinc alloy blank processed by step 4 into a physical vapor deposition (PVD) furnace to perform plasma processing, and then perform film plating processing through PVD.

6. Perform intermediate layer paint spraying, for the zinc alloy blank transferred into the paint spraying and UV curing line, and then perform leveling and UV curing. Subsequently, perform spraying of transparent UV surface paint, leveling, and UV curing. In the process of curing the intermediate layer paint using UV light, the color of the plated hexavalent chromium can be obtained, to complete surface processing of high etch resistance zinc alloy having imitated color of hexavalent chromium.

The surface processing method of the imitation hexavalent chromium color adopts a thermal curing electrophoresis primer, with its curing temperature at 140-170° C. However, in the casted and pressed zinc alloy piece, blister nests are liable to exist. In a baking temperature of 140-170° C., the electrophoresis application layer tends to produce craters and pits, such that its outer appearance is defective, its yield is low, the hardness of the plated layer and its abrasion resistance are insufficient. In addition, that patent case utilizes large quantity of chemicals to remove wax and grease on the surface of the zinc alloy, thus producing large amount of waste water.

In another China Patent Case No. CN 102758176A is disclosed "An all dry composite film plating method for a metal surface". In that patent, surface processing is performed for the imitation plating hexavalent chromium, directly on a polished surface of a metal substrate. The demand for polishing the metal substrate is rather high, since the polished surface has to be as glaring as a mirror. In this respect, that patent is not capable of eliminating the blister nests on the surface of the casted and pressed zinc alloy piece.

Therefore, presently, the design and performance of a surface processing method for a zinc alloy surface of imitation plating hexavalent chromium is not quite satisfactory, and it has much room for improvement.

SUMMARY OF THE INVENTION

In view of the problems and drawbacks of the prior art, the present invention provides a surface processing method for a high hardness and abrasion resistant zinc alloy surface of imitation plating hexavalent chromium, to overcome the shortcomings of the conventional electroplating of hexavalent chromium of the prior art.

In order to achieve the objective mentioned above, the present invention provides a surface processing method for a high hardness and abrasion resistant zinc alloy surface of imitation plating hexavalent chromium, comprising:

1. Perform polishing for the surface of a zinc alloy workpiece, then in vacuum, utilize a hydrocarbon cleaning agent to remove grease stain on the surface of the workpiece, and leave it to dry in vacuum. In this approach, hydrocarbon cleaning agent is used to remove wax and grease, and then dry it in vacuum. Therefore, no damages are done to the substrate, and also, no waste water, no waste scum, and no toxic gases are released.

2. Place the dried up workpiece into Hydrofluoric Acid solution of weight concentration 1.5%-2%, at a temperature of 15° C.-35° C., to be immersed and activated for 10-35 seconds, to remove the oxide film and the attached dust from the surface of the workpiece, and to raise the adhesion between the silane conversion film and the zinc alloy substrate.

3. Wash the activated workpiece clean with pure water, and then place it in a silane oxide solution in a tank, to process it into a silane conversion film. The silane oxide solution is a mixture of OXSILAN 9830, OXSILAN Additive 9906 or OXSILAN Additive 9905, and pure water. Wherein, the weight concentration of OXSILAN 9830 is 1.0-1.5%, the weight concentration of OXSILAN Additive 9906 or OXSILAN Additive 9905 is 2.0-2.5%, while the rest is pure water. The reason for adopting OXSILAN Additive 9951 or OXSILAN Additive 9960 is to regulate the PH value of the silane oxide solution.

In the descriptions above, the activation point of the silane conversion film is 1.0-6.5, with its PH value of 3.0-6.0, and its conductivity <2500 µS/cm, at a temperature of 15° C.-35° C., for processing period of 30-150 seconds, to achieve a silane conversion film of thickness 0.05-0.5 µm. After processing, the workpiece is washed with pure water. The reasons for adopting silane conversion film processing is that, it is able to increase adhesion between the UV electrophoresis application layer and the zinc alloy substrate, while raising its erosion resistant capability.

4. Place the workpiece into the electrophoresis solution to perform electrophoresis. The electrophoresis solution includes: UC-2000 electrophoresis resin paint used to form films, solvent, and pure water. Wherein, the solvent is ethylene glycol butyl ether, having weight concentration of 1.0-2.5%, while the solid contents is 10±2%. The pH value of the electrophoresis solution is 3.4-4.5, with its conductivity of 200-400 µS/cm, and acid value (AV) of 16-25KOH mg/g. The electrophoresis is performed at a temperature of 20-30° C., with an electrophoresis voltage of 30-70V for an electrophoresis period of 30-180 seconds. The electrode is made of graphite or stainless steel. In the electrophoresis process, a pump is used to stir and blend the electrophoresis solution repeatedly, to achieve an electrophoresis application layer of thickness 5-20 µm. In the present invention, high luminance transparent UV electrophoresis is adopted, so that the hardness of the applied layer thus obtained is high, and it can be cured at fast speed in a low temperature. To the zinc alloy workpiece of complex structure having blind holes, since the applied layer covers its entire surface, therefore its erosion resistant capability is raised, the leveling of the substrate defects is effective, and the illuminance of the electrophoresis application layer is high. In this respect, the plated film made through PVD could achieve the surface effect as glaring as a mirror.

5. Use an UF solution to wash the workpiece after electrophoresis, then wash it with water, and use air to blow and dry the surface of the workpiece.

6. Perform pre-drying for the workpiece at a temperature of 75±5° C. for a pre-drying period of 15±5 minutes.

7. Perform UV curing for the workpiece through using a high voltage mercury lamp, with UV energy above 2800-4000 mj/cm$^2$.

8. Hang the workpiece in a PVD furnace, and after evacuating it into vacuum, introduce in the inert gas. Next, turn on the ion source, to perform ion glowing activation. Then, turn off the ion source, and after evacuating the PVD furnace into vacuum, introduce in inert gas. Subsequently, turn on the bias power supply, the electrical arc target, and the sputter target power supply, to perform sputtering of chromium. Finally, turn off the bias power supply, to perform PVD of chromium nitride, to form a composite film of metal and ceramic on the surface of the workpiece.

In the descriptions above, the inert gas mentioned is a mixture of Ar gas and $O_2$ gas, and that is used for an ion glowing activation period of 1-8 minutes, while the reaction gas is $N_2$ gas. Moreover, the sputtering of chromium and chromium nitride is performed for a period of 1-35 minutes, to obtain a metal-ceramic composite film of thickness 0.1-2.5 µm.

The reason for performing PVD separately for chromium and chromium nitride is to effectively avoid the cracks caused by the high stress of chromium nitride.

9. Finally, perform PVD on the surface of the workpiece. That is achieved through utilizing electric arc to deposit and form a layer of DLC film on the surface of a workpiece, to raise the hardness and abrasion resistance of the zinc alloy piece. The thickness of the DLC film can be adjusted depending on requirements.

Compared with the prior art, the advantages of the present invention can be summarized as follows: 1. The present invention eliminates the problem of the prior art of low yield caused by blister nests due to casting and pressing of the plated zinc alloy, to improve its quality and raise its yield. 2. In the production process, no waste water, no waste scum, and no toxic gas are released, thus it is friendly to human and environment. 3. The manufacturing steps are simple, while their energy consumption is low. 4. Color of the imitated and plated hexavalent chromium of the zinc alloy is comparable to that of the plated layer of real hexavalent chromium, so that their outer appearances are similar. 5. The surface of the plated layer thus produced is of high hardness, and is abrasion resistant, thus it is comparable to the plated layer of real hexavalent chromium. As such, the method of the present invention is especially applicable to process the accessories used in automobile, bathing and sanitary equipment, and household electrical appliance, etc.

Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from this detailed descriptions.

BRIEF DESCRIPTION OF THE DRAWINGS (no drawings)

DETAILED DESCRIPTION OF THE PREFERRED EMBODIMENT

The purpose, construction, features, functions and advantages of the present invention can be appreciated and understood more thoroughly through the following detailed description with reference to the attached drawings.

In the following embodiments, the surface processing of a handle of the bathing and sanitary equipment made of zinc alloy is taken as an example, to explain the surface processing method for a high hardness and abrasion resistant zinc alloy surface of imitation plating hexavalent chromium of the present invention, which includes the following steps:

1. Perform polishing for the surface of a zinc alloy handle to be processed, then in vacuum, utilize a hydrocarbon cleaning agent to remove grease stain on the surface of the handle, and leave it to dry in vacuum.

2. Place the dried up workpiece into Hydrofluoric Acid solution of weight concentration 1.5%-2%, at a temperature of 15° C.-35° C., to be immersed and activated for 10-35 seconds. After activation, the handle is washed clean with pure water.

3. Place the handle washed clean in a silane oxide solution in a tank, to process it into a silane conversion film. In the present embodiment, the silane oxide solution is a mixture of OXSILAN 9830, OXSILAN Additive 9906 (both manufactured by Chemetall), and pure water; while OXSILAN Additive 9906 can be replaced with OXSILAN Additive 9905. In the silane oxide solution, the weight concentration of OXSILAN 9830 is 1.0-1.5%, the weight concentration of OXSILAN Additive 9906 is 2.0-2.5%, while the rest is pure water. The reason for adopting OXSILAN Additive 9951 or OXSILAN Additive 9960 is to regulate the PH value of the silane oxide solution in the tank to 3.0-6.0.

In the descriptions above, the activation point of the silane conversion film is 1.0-6.5, with its PH value of 3.0-6.0, and its conductivity <2500 μS/cm, at a temperature of 15° C.-35° C., for a processing period of 30-150 seconds, to achieve a silane conversion film of thickness 0.05-0.5 μm. After processing, the handle is washed clean with pure water. The reason for adopting silane conversion film processing is that, it could increase adhesion between the UV electrophoresis application layer and the zinc alloy substrate, while raising its erosion resistant capability.

4. Place the handle into the electrophoresis solution to perform electrophoresis. The electrophoresis solution includes: UC-2000 electrophoresis resin paint (belong to the ELECOAT series product made by Shimizu Akira Inc of Japan) used to form films, solvent, and pure water. Wherein, the solvent is ethylene glycol butyl ether, having weight concentration of 1.0-2.5%, while the solid contents is 10±2%. The pH value of the electrophoresis solution is 3.4-4.5, with its conductivity of 200-400 μS/cm, and acid value (AV) of 16-25KOH mg/g. The electrophoresis is performed in a temperature of 20-30° C., with electrophoresis voltage of 30-70V for an electrophoresis period of 30-180 seconds. The electrophoresis period corresponds to the thickness of the electrophoresis application layer. The electrode is made of graphite or stainless steel. In the electrophoresis process, a pump is used to stir and blend the electrophoresis solution repeatedly, to achieve an electrophoresis application layer of thickness 5-20 μm. In the present embodiment, the thickness of the electrophoresis application layer is 10 μm, for an electrophoresis period of 100 seconds. High luminance transparent UV electrophoresis is adopted, so that the hardness of the applied layer thus obtained is high, and it can be cured at fast speed in a low temperature. To the zinc alloy piece of complex structure having blind holes, since the applied layer covers its entire surface, such that its erosion resistant capability is raised, the leveling of the substrate defects is effective, and the illuminance of the electrophoresis application layer is high. In this respect, the plated film made through PVD could achieve the surface effect as glaring as a mirror.

5. Use UF solution to wash the handle after electrophoresis, then wash it with pure water, and use air to blow the surface of the handle to dry.

6. Put the handle into an infrared furnace to perform pre-drying at a temperature of 75±5° C. for a pre-drying period of 15±5 minutes.

7. Put the handle into an UV curing furnace to perform UV curing through using a high voltage mercury lamp, with UV energy above 2800-4000 mj/cm$^2$.

8. Hang the handle in a PVD furnace, and after evacuating it into vacuum of $8 \times 10^{-3}$ Pa. Next, turn on the ion source, introduce in an inert gas as the protection gas, to perform the ion glowing activation. The parameters for ion glowing activation are as follows: ion source current 0.3A, bias 450V, duty ratio 50%, vacuum pressure in PVD furnace 0.2 Pa, the operation gas flow is a mixed gas flow of Ar and $O_2$ with a mixture ratio of 300 SCCM: 200 SCCM, glowing period is 1 minute, while the pause period is 1 minute.

Then, turn off the ion source, and after evacuating the PVD furnace into vacuum, introduce in the reaction gas of inert gas. Subsequently, turn on the bias power supply, the electrical arc target power supply, and the sputter target power supply, to perform sputtering of chromium and chromium nitride, to form a composite film of metal and ceramic on the surface of the handle. The details of the process mentioned above are explained as follows:

Firstly, deposit a layer of metal Cr film of thickness 0.2 μm on an electrophoresis application layer, pause for 1 minute, then deposit thereon a layer of ceramic film CrN of thickness 0.5 μm. Then, repeat the steps mentioned above three times.

Subsequently, deposit on the surface of the handle a layer of metal Cr film of thickness 0.2 μm.

The parameters for depositing the layer of metal Cr film are as follows: electrical arc chromium target current 75A, sputter chromium target current 60A, introducing Ar gas of 200 SCCM, in a vacuum pressure of 0.2 Pa, to perform depositing for 1 minute.

The parameters for depositing the layer of CrN ceramic film are as follows: sputter chromium target current 60A, introducing Ar gas of 100 SCCM and $N_2$ gas of 160 SCCM, to perform film plating for 2 minutes; vacuum evacuating period 11 minutes, accumulated gas filling period 2 minutes, accumulated film deposit period 28 minutes, gas release period 1 minute, the entire film deposit completion period 42 minutes in a depositing temperature of 104° C.

9. Finally, perform PVD on the surface of the handle, to form a DLC film, and that is realized through utilizing electric arc to deposit by means of installing a magnetic filtering device at the front portion of the electrical arc source. In this way, a high hardness and abrasion resistant transparent DLC film is formed on the surface of the handle, and having a thickness of 20 nm.

10. Perform functional tests for the handle:
   (A) CASS corrosion resistance test: 16 hours; tested through using ASTM B368-09;
   (B) thermal cycling test: 8 cycles; tested through using ASTM G85-09;
   (C) sand blast impact test: 18L falling sand; tested through using ASTM D968-05;
   (D) adhesion (hundred cuts) test: 5B; tested through using ASTM D3359-02;
   (E) water immersion test at 38° C.: 24 hours ; tested through using ASTM D870-02;
   (F) pencil hardness (TURQUOISE brand pencil): 4 hours; tested through using ASTM D3363-05;
   (G) RCA abrasion resistance test: 1000 times; tested through using ASTM D5178-9; and
   (H) scratch resistance test, tested through using ASTM D5178-9.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A surface processing method for a high hardness and abrasion resistant zinc alloy surface of imitation plating hexavalent chromium, comprising the successive steps:
   (1). performing polishing for a surface of a zinc alloy workpiece, then in vacuum, utilizing a hydrocarbon cleaning agent to remove grease stain on the polished surface of said workpiece, and leaving said workpiece to dry in the vacuum;
   (2). placing said dried up workpiece into hydrofluoric acid solution of weight concentration percentage 1.5%-2%, at a temperature of 15-35° C., to be immersed and activated for 10-35 seconds, to remove an oxide film and dust from an acidulated surface of said workpiece, and to increase adhesion between a silane conversion film to be formed and said workpiece;

(3). washing said activated workpiece clean with pure water, and then placing said workpiece in a silane oxide solution in a tank, to process said workpiece with said silane conversion film, wherein said silane oxide solution is a mixture of silane treatment agent, zirconium fluoride treatment agent, and pure water, wherein, based on weight of said silane oxide solution, weight concentration percentage of the silane treatment agent is 1.0-1.5%, weight concentration percentage of the zirconium fluoride treatment agent is 2.0-2.5%, and the rest is the pure water, wherein adopting sodium hydroxide solution or nitric acid solution is for regulating pH value of said silane oxide solution in said tank, an activation point of said silane conversion film is 1.0-6.5, said silane conversion film has a pH value of 3.0-6.0, and said silane conversion film has a conductivity <2500 µS/cm, at a temperature of 15-35° C., for a processing period of 30-150 seconds, to achieve said silane conversion film in a layer of thickness 0.05-0.5 µm; then washing said workpiece with the pure water;

(4). placing said workpiece into an electrophoresis solution to perform electrophoresis, wherein, based on weight of said electrophoresis solution, said electrophoresis solution includes: solid contents of 10±2%, said electrophoresis solution having pH value of 3.4-4.5, with conductivity of 200-400 µS/cm, acid value (AV) of 16-25 KOH mg/g; and ethylene glycol butyl ether as a solvent, of weight concentration percentage 1.0 to 2.5%; the electrophoresis is performed at a temperature of 20-30° C., with an electrophoresis voltage of 30-70 V for an electrophoresis period of 30-180 seconds; electrodes are made of graphite or stainless steel; in said electrophoresis process, a pump is used to stir and blend said electrophoresis solution repeatedly, to achieve an electrophoresis application layer of thickness 5-20 µm;

(5). using an ultra-frequency (UF) solution to wash said workpiece after the electrophoresis, then washing said workpiece with the pure water, and using air to blow the washed surface of said workpiece to dry;

(6). performing pre-drying for said workpiece at a temperature of 75±5° C. for a pre-drying period of 15±5 minutes;

(7). performing ultraviolet (UV) curing for said workpiece through using a high voltage mercury lamp, with UV energy above 2800-4000 mJ/cm$^2$;

(8). hanging said workpiece in a physical vapor deposition (PVD) furnace, after evacuating said workpiece into vacuum, introducing in inert gas and turning on an ion source, to perform ion glowing activation; turning off said ion source, and after evacuating said PVD furnace into vacuum, introducing in the inert gas, turning on a bias power supply, an electrical arc target power supply and a sputter target power supply, to perform sputtering of chromium; turning off said bias power supply, to perform PVD of chromium nitride, to form a metal-ceramic composite film on said workpiece; wherein operation gas is argon gas and oxygen gas, while a reaction gas is nitrogen gas, and said ion glowing activation is performed for a period of 1-8 minutes; sputtering of the chromium and the chromium nitride is performed for a period of 1-35 minutes, to obtain said metal-ceramic composite film of thickness of 0.1-2.5 µm; and (9). finally, performing PVD on the metal-ceramic composite film of said workpiece to deposit and form a layer of transparent diamond like carbon (DLC) film on said workpiece by utilizing electric arc operation.

* * * * *